(12) United States Patent
Harting et al.

(10) Patent No.: US 6,416,350 B1
(45) Date of Patent: Jul. 9, 2002

(54) CONTACT FOR CONDUCTOR FOIL

(75) Inventors: Dietmar Harting, Espelkamp (DE); Bob Mouissie, Berlicum (NL); Jens Krause, Rahden; Thomas Heimann, Espelkamp, both of (DE)

(73) Assignee: Harting Automotive GmbH & Co. KG (DE)

( * ) Notice: Subject to any disclaimer, the term of this patent is extended or adjusted under 35 U.S.C. 154(b) by 0 days.

(21) Appl. No.: 09/704,029

(22) Filed: Nov. 1, 2000

(30) Foreign Application Priority Data

Nov. 2, 1999 (DE) .......................... 199 52 752

(51) Int. Cl.[7] .............................................. H01R 11/20
(52) U.S. Cl. ........................ 439/422; 439/729; 439/459
(58) Field of Search ................................ 439/422–426, 439/729, 863, 816, 822, 862, 725, 459, 495

(56) References Cited

U.S. PATENT DOCUMENTS

| 3,825,881 A | * | 7/1974 | Wigby | 439/422 |
| 3,851,945 A | * | 12/1974 | Collier | 439/729 |
| 4,560,224 A | * | 12/1985 | Weisenburger | 439/422 |
| 4,591,224 A | * | 5/1986 | Araiza | 439/729 |
| 4,669,798 A | * | 6/1987 | Daum et al. | 439/423 |
| 4,797,125 A | * | 1/1989 | Malana | 439/729 |
| 4,832,620 A | * | 5/1989 | Yamamoto | 439/422 |
| 4,975,081 A |   | 12/1990 | Daly et al. | 439/498 |
| 5,299,954 A | * | 4/1994 | Ishii | 439/422 |
| 6,062,915 A | * | 5/2000 | Costello et al. | 439/729 |
| 6,135,779 A | * | 10/2000 | Koch et al. | 439/422 X |

FOREIGN PATENT DOCUMENTS

| EP | 0 129 083 A1 | 12/1984 |
| EP | 0 286 422 A2 | 10/1988 |
| EP | 0 654 849 A2 | 5/1995 |
| WO | WO 98/11629 | 3/1998 |

* cited by examiner

*Primary Examiner*—Brian Sircus
*Assistant Examiner*—Son V. Nguyen
(74) *Attorney, Agent, or Firm*—Cook, Alex, McFarron, Manzo, Cummings & Mehler, Ltd.

(57) ABSTRACT

For a contact means for conductor foils which comprise at least one conductor path (14), an especially reliable contact for a long period of time shall be guaranteed. To this end the contact means comprises a pressure element (16) which is provided with a projection (24) presenting a continuous pressure surface (25), and a counter pressure element (18) provided with a recess (28) the contour of which is adapted to the shape of the pressure surface, the projection being prestressed elastically against the counter pressure element such that a conductor foil to be contacted is clamped between the pressure surface (25) and the edge of the recess (28). Thus, it is possible to maintain a constant contact force even if the conductor foil eventually yields.

5 Claims, 2 Drawing Sheets

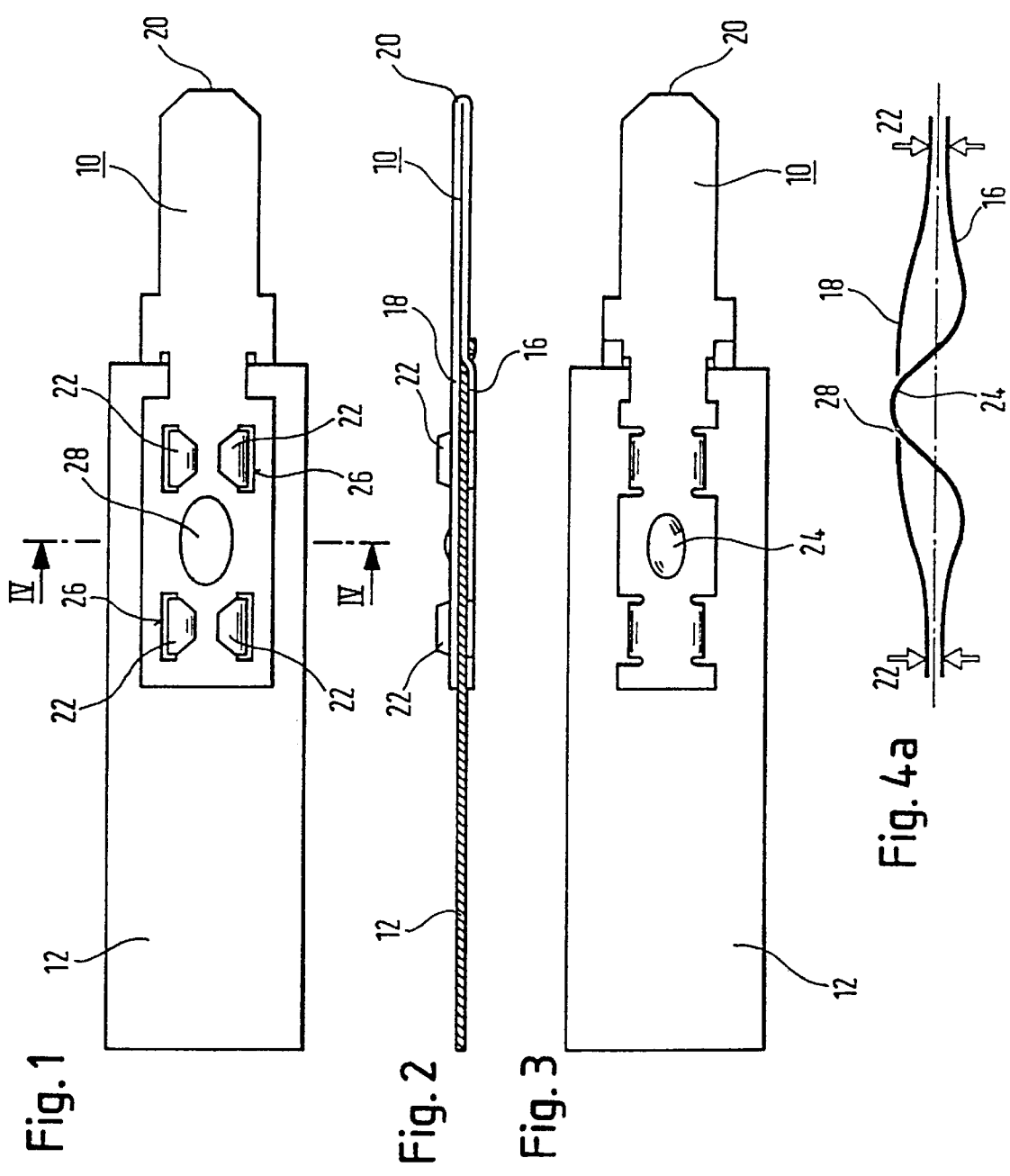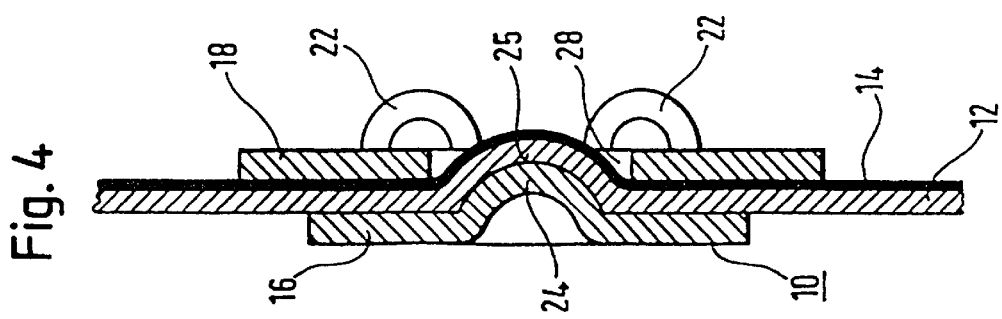

CONTACT FOR CONDUCTOR FOIL

The invention relates to contact means for conductor foils.

There is known a contact element of the Dupont Company serving to enable to make a contact with the conductor path of the conductor foil at any location, in order, for example, to connect a cable to the conductor path or to make a connection to a conductor path of an other conductor foil. In order to make a contact with the conductor path of the conductor foil, a contact piece provided with holding clips is placed on the conductor foil and is subsequently pressed onto the conductor foil such that the holding clips cut through the conductor foil and the conductor path and exit on the rear face. Finally, the holding clips are crimped over outwards such that the contact piece is fixedly connected to the conductor foil. Thus, the contact with the conductor path is attained by means of the holding clips which are pressed against the conductor paths.

The known contact means presents the disadvantage that the quality of the attained contact gradually deteriorates, because the synthetic material of the conductor foil slowly yields under the pressure applied by the holding clips. Thus, the contact force acting at the contact location is gradually reduced such that the gas tightness of the contact location, on the one hand, and the required contact pressure at the contact location, on the other hand, are not reliably guaranteed.

From WO 98/11629 there is known a contact element provided with a spring clip. The spring clip presents a spherical pressure surface and the contact element is provided with a circular recess. The contact with the conductor path of the conductor foil is attained in the region of the circular pressure line between the edge the recess and the pressure surface.

It is therefore the object of the invention to provide a contact means for conductor foils which guarantees the quality of the contact even for very long periods of time and which at the same time is suitable for large current intensities.

To this end according to the invention there is provided a contact means for conductor foils which comprises at least one conductor path, the contact means comprising a pressure element which is provided with a projection presenting a continuous pressure surface, and a counter pressure element provided with a recess the contour of which is adapted to the shape of the pressure surface, the projection being prestressed or biased elastically against the counter pressure element such that a conductor foil to be contacted is clamped between the pressure surface and the edge of the recess. The invention basically relies on the combination of a line contact of the conductor path and of an elastic prestress or elastic bias. The line contact ensures that the contact is attained along precisely defined regions of the conductor path. This is very important because of the fact that a surface pressure at the conductor path which is considered to be advantageous for the respective application can be maintained only if the contact area is known. The elastic prestress of the projection against the edge of the recess in the counter pressure element serves to maintain the contact force once adjusted even if the conductor foil gradually begins to yield due to the applied contact force.

Preferably the pressure surface has the shape of pyramid or a truncated pyramid and the recess has a polygonal shape adapted to the cross-section of the pyramid. Alternatively, the pressure surface has the shape of an ellipsoid or of a part of an ellipsoid and the recess is shaped elliptical. The advantage of this shaping is that a comparatively long line contact between the edge of the recess and the pressure surface is attained with respect to the "footing" of the recess, which is in particular longer than with a circular recess. In view of the fact that most contacts are rectangular there can be attained with the same contact width a contact area which is much more larger than with a circular recess by using an elliptical or a long rectangular recess.

However, alternatively, it is conceivable to use the circular recess already known in the prior art along with a spherical pressure surface; in this case, however, the above mentioned advantage of an optimal utilization of the area is not attained.

According to an embodiment of the invention the pressure element and the counter pressure element consist of sheet metal, the projection being formed by an embossing on the pressure element and the recess being formed by an opening punched in the counter pressure element. This embodiment results in very small manufacturing costs for the connection contact means.

Preferably the pressure element and the counter pressure element are attached to each other by holding clips which are arranged on both sides of the projection and of the recess such that the inherent material elasticity of both elements prestresses the projection against the recess. The holding clips allow to attach both elements to each other by comparatively simple means. Preferably the holding clips are arranged such that they automatically cut through the conductor foils so that corresponding openings are not to be pre-punched.

The pressure element and the counter pressure element may be integrally formed. Thereby the assembly is facilitated, since only one piece has to be manipulated. For assembly preferably one of both elements is arranged on the conductor foil and subsequently the other element is bent by 180° such that it is folded back onto the conductor foil and lies opposite to the other element. The bending region in which the pressure element is connected to the counter pressure element is preferably formed at the end of a contact clip of the contact means, said contact clip protruding from the conductor foil and allowing the contact of the contact means by means of a cable lug, for instance.

According to a second embodiment the pressure element is a resilient clip being attached to an insulating casing and having a free end at which the projection is formed, and that the counter pressure element is a contact tongue in which the recess is punched out. In this embodiment the contact means is formed in the nature of a connector having a casing which can be gripped very good and which can be inserted into an associated connection.

Preferably the resilient clip is provided with a retention nose which can cooperate with a retention recess in the contact tongue. In this manner a tension relief is formed.

Advantageously the casing is provided with a recess for a leaf spring which can be inserted afterwards and which prestresses the projection against the recess. This allows to insert the conductor foil into the contact freely at first until it is placed in its correct position. Only then a tension force is produced by inserting the leaf spring, said force providing the required contact force, on the one hand, and clamps the conductor foil in the casing, on the other hand. By this functional and constructive separation of the pressure surface from the spring action the contact force can be adapted to the respective suitable contact force independently of the shape of the contact tongue by selecting a suitable leaf spring.

Independently of the respective embodiment the pressure surface and the recess are preferably dimensioned such that the length of the edge of the recess is approximately equal to the width of the conductor path to be contacted. If, for example, a square recess is used its width is selected such that it lies in the order of nearly a quarter of the width of the conductor path to be contacted. Such dimensioning has proved to be advantageous for the current carrying in the junction region between the contact and the conductor path.

Advantageous embodiments of the invention appear from the sub-claims.

The invention is described subsequently with respect to two embodiments shown in the accompanying drawing. In the drawing:

FIG. 1 shows a contact means according to a first embodiment of the invention in a plan view;

FIG. 2 shows the contact means of FIG. 1 in a side view;

FIG. 3 shows the contact means of FIG. 1 in a bottom view;

FIG. 4 shows a section along the plane IV—IV through the contact means of FIG. 1 in an enlarged scale;

FIG. 4a shows a schematic diagram of the clamping forces acting at the contact means.

Figure 5:
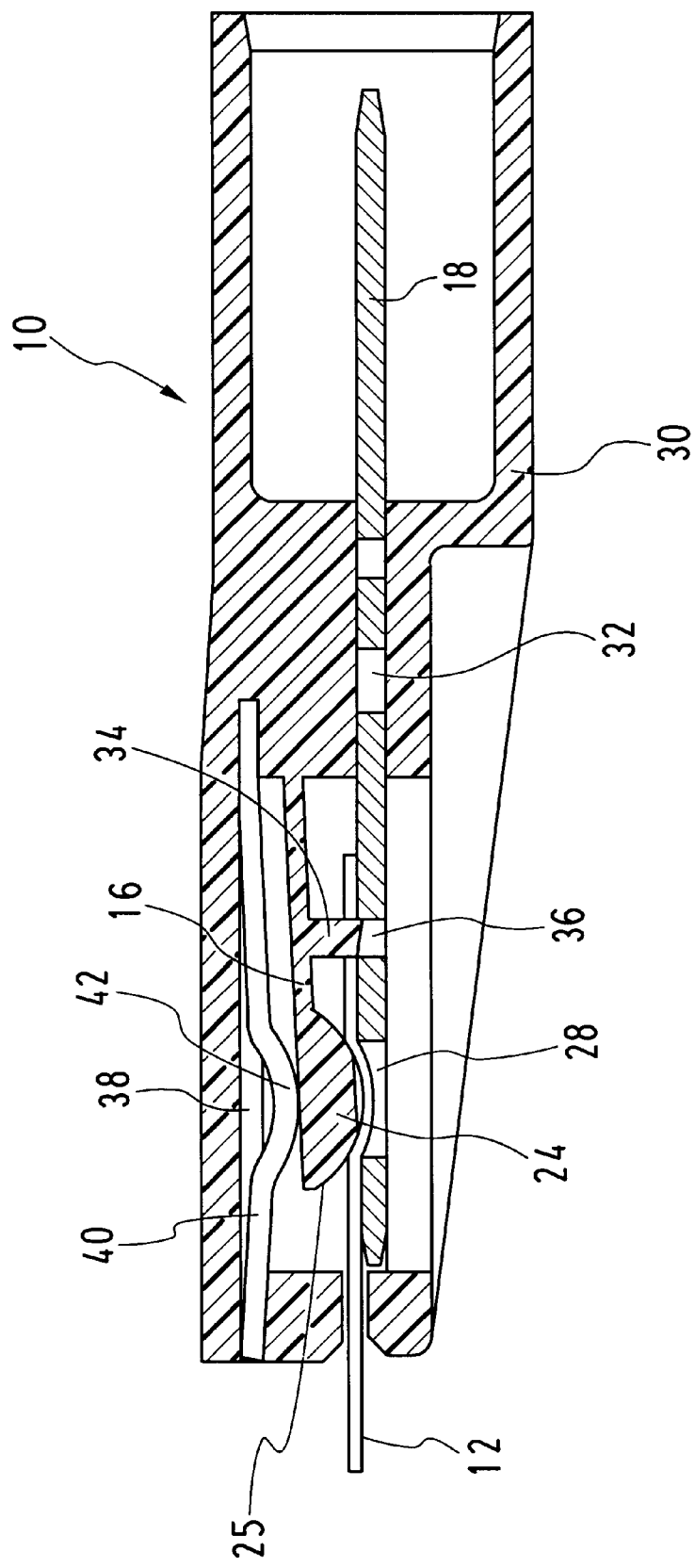
FIG. 5 shows a contact means according to a second embodiment in a sectional view.

In FIGS. 1 to 4 a contact means according to a first embodiment is shown. The contact means 10 serves to make a contact with a conductor path 14 of a conductor foil 12. The conductor path 14 is exposed in the region in which the contact 10 engages; in the case in which an insulating layer is provided this layer must be removed before attaching the contact.

The contact means 10 consists of a pressure element 16 and a counter pressure element 18 both being made from sheet metal and being integrally connected to each other by a bending portion 20. The pressure element 16 is provided with four holding clips 22 and with a projection 24. The projection is arranged approximately in the center between the holding clips and has such a sectional shape that its surface forms a portion of an ellipsoid. This surface represents a pressure surface 25 for the conductor foil.

The counter pressure element 18 is provided with four openings 26 for the holding clips 22 and with a recess 28 which here has an elliptic shape.

The contact means 10 consists of sheet metal and is preferably punched out. In so doing, the openings 26 as well as the recess 28 may be formed in the same manufacturing step. The projection 24 is preferably formed by embossing the pressure element.

According to a further development (not shown) of the invention it is possible to punch out a plurality of contacts linked with each other in the initial state such that the contacts may be supplied to a processing apparatus in the form of a strip. In this apparatus only the connection bridges between the single contacts are cut through.

The connection of the contact means to the conductor path is performed in the following manner: the pressure element 16 is placed at the conductor foil 12 on the side not provided with the conductor path 14. Subsequently the conductor foil 12 is pressed against the pressure element such that the holding clips 22, which are chamfered at their free end, cut through the conductor foil. Subsequently the counter pressure element is folded back onto the pressure element and onto the conductor foil arranged thereon by bending the counter pressure element in the region of the bending portion 20 such that the holding clips 22 extend through the openings 26. Finally, the holding clips 22 are crimped over such that they are supported on the counter pressure element 18 and firmly hold the pressure element on the counter pressure element.

Considering the thickness and the rigidity of the conductor foil, the projection 24 as well as the recess 28 are dimensioned such that the projection can not completely immerse into the recess 28. i.e. even in the assembled state a gap remains between the pressure element 16 and the counter pressure element 18 in the region of the edge of the recess. However, since the holding clips 22 are arranged at a distance from the projection 24 and the pressure element as well as the counter pressure element 18 are firmly pressed against each other in the region of the holding clips, the pressure element 16 and the counter pressure element 18 are bent elastically such that a prestress results. This is shown schematically and in an exaggerated way in FIG. 4a. Thus, at the edge of the recess 28 a well-defined contact force between the counter pressure element 18 and the conductor path 14 is attained. Due to the elastic prestress of the pressure element 16 and of the counter pressure element 18, this contact force is maintained even if a small yield of the conductor foil appears in time due to the acting contact force, so that the thickness of the conductor foil is slightly reduced.

The recess 28 is dimensioned such that the edge of the recess which provides the actual contact region for the conductor path 14 has a length which is approximately equal to the width of the conductor path to be contacted.

Unlike the elliptic recess shown there may also be used a polygonal recess. In view of the optimal utilization of the surface an oblong rectangular recess is particularly suitable. Obviously the pressure surface has a complementary shape in this case, in particular the shape of a truncated pyramid.

After making the contact with the conductor path another contact at the contact means 10 may be made by means of, for example, a cable lug slid onto the clip which protrudes from the conductor foil and in the region of which the bending portion 20 is arranged. Alternatively, this clip may be provided with an opening for a bolt, for example.

According to another further development (likewise not shown) of the invention, it is possible to form a plurality of recesses adjacent to each other in the respective contact means. In this manner the contact surface between the contact means and the conductor path is increased such that larger currents may be carried.

In FIG. 5 a contact means according to a second embodiment is shown. For the structural members which are already known from the first embodiment the same reference numerals are used and it is referred to the explanations above. In the second embodiment the contact means 10 comprises a casing 30 in which the counter pressure element 18 is arranged. This element is formed as a contact tongue which is accommodated in the casing 30. Locking apertures 32 may be provided in order to improve the attachment of the contact tongue in the casing 10.

In the second embodiment the pressure element 16 is formed as a resilient clip at the free end of which the projection 24 is formed. The pressure surface 25 of the projection 24 is formed as a layer plane of an ellipsoid. On the resilient clip a retention nose 34 is formed which is able to co-operate with a retention recess 36 formed in the counter pressure element 18.

In the casing a recess 38 is provided into which a leaf spring 40 may be inserted. This leaf spring 40 is provided with a bending portion 42 which may engage at the rear face of the projection facing away from the conductor foil 12.

The contact means described above is assembled in the following manner: at first the isolation of the conductor path in the region in which the contact means is to be slid on is removed. Simultaneously an opening is punched out in the conductor foil in which the retention nose may engage later. Subsequently the conductor foil is inserted into the casing. Then the leaf spring is inserted into the recess 38, thereby pressing the pressure element 16 along with the projection 24 elastically against the conductor foil and the counter pressure element 18. The projection now presses the conductor foil along with the conductor path against the edge of the recess 28 so that the contact is guaranteed. When the pressure element is deflected the retention nose engages with the retention recess 36 through the opening punched out in the conductor foil such that the conductor foil is fixed in the casing and a tension relief is produced.

The leaf spring ensures that a constant contact force between the pressure surface 25 and the edge of the recess 28 is guaranteed regardless of any yield of the conductor foil.

In both embodiments only that surface area of the conductor path which is pressed against the edge of the recess by the pressure surface is relevant for the attained contact. Outside of this region the projection may be formed in almost any way; it might even be accepted that the conductor foil along with the conductor path tears inside of the recess if it cannot follow the course predetermined by the projection. This does not affect the contact, since the current conductor takes place directly from the edge of the recess to the outside into the conductor path.

What is claimed is:

1. A contact means for conductor foils which comprise at least one conductor path (14), said contact means comprising a pressure element (16) which is provided with a projection (24) presenting a continuous pressure surface (25), and a counter pressure element (18) provided with a pressure recess (28), said pressure recess having a shape which is adapted to a shape of said pressure surface, said projection being prestressed elastically against said counter pressure element such that one of the conductor foils to be contacted is clamped between said pressure surface (25) and the edge of said pressure recess (28), said pressure element (16) being a resilient clip and including one end which is mounted on an insulating casing (30) and a free end at which said projection (24) is formed, said counter pressure element (18) being a contact tongue in which said recess (28) is punched out, said casing being provided with a casing recess (38) for a leaf spring (40) which is insertable afterwards and prestresses said projection (24) against said pressure recess (28).

2. The contact according to claim 1, wherein said pressure surface (25) has a shape of a pyramid or a truncated pyramid and that said pressure recess (28) has a polygonal shape adapted to a cross-section of the pyramid.

3. The contact according to claim 1, wherein said pressure surface (25) has a shape of an ellipsoid or of a part of an ellipsoid and that said pressure recess (28) is elliptically shaped.

4. The contact according to claim 1, wherein said pressure element (16) and said counter pressure element (18) consist of sheet metal, said projection (24) being formed by an embossing on said pressure element and said pressure recess (28) being formed by an opening punched in said counter pressure element.

5. The contact according to claim 1, wherein said resilient clip is provided with a retention nose (34) which can co-operate with a retention recess (36) in said contact tongue.

* * * * *